(12) United States Patent
Rhee

(10) Patent No.: US 9,391,051 B2
(45) Date of Patent: Jul. 12, 2016

(54) DISPLAY DEVICE USING SEMICONDUCTOR LIGHT EMITTING DEVICE AND METHOD OF FABRICATING THE SAME

(71) Applicant: LG ELECTRONICS INC., Seoul (KR)

(72) Inventor: Byungjoon Rhee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/417,691

(22) PCT Filed: Jun. 11, 2013

(86) PCT No.: PCT/KR2013/005126
§ 371 (c)(1),
(2) Date: Jan. 27, 2015

(87) PCT Pub. No.: WO2014/030830
PCT Pub. Date: Feb. 27, 2014

(65) Prior Publication Data
US 2015/0221619 A1 Aug. 6, 2015

(30) Foreign Application Priority Data
Aug. 21, 2012 (KR) .................. 10-2012-0091112

(51) Int. Cl.
| | |
|---|---|
| H01L 29/20 | (2006.01) |
| H01L 25/075 | (2006.01) |
| H01L 33/50 | (2010.01) |
| H01L 33/62 | (2010.01) |
| H01L 27/12 | (2006.01) |
| H01L 33/48 | (2010.01) |

(52) U.S. Cl.
CPC ........ *H01L 25/0753* (2013.01); *H01L 27/1248* (2013.01); *H01L 33/486* (2013.01);
(Continued)

(58) Field of Classification Search
CPC ... H01L 27/32–27/326; H01L 51/50–51/5012; H01L 51/525–51/5287; H01L 2227/32–2227/326; H01L 2251/5323–2251/5361; H01L 2924/12044
See application file for complete search history.

(56) References Cited

U.S. PATENT DOCUMENTS

| | | | | |
|---|---|---|---|---|
| 5,453,386 | A | * 9/1995 | Holm | .................. H01L 27/156 438/34 |
| 2005/0140282 | A1 | 6/2005 | Park et al. | |

(Continued)

FOREIGN PATENT DOCUMENTS

| | | |
|---|---|---|
| CN | 101324306 A | 12/2008 |
| CN | 102576783 A | 7/2012 |

(Continued)

*Primary Examiner* — David Vu
*Assistant Examiner* — Cuong B Nguyen
(74) *Attorney, Agent, or Firm* — Birch, Stewart, Kolasch & Birch, LLP

(57) ABSTRACT

A display device using a semiconductor light emitting device and a method of fabricating the semiconductor light emitting device are disclosed. The display device includes a substrate, a plurality of first electrodes disposed on the substrate, an anisotropic conductive film disposed on the substrate provided with the first electrodes, a plurality of semiconductor light emitting devices disposed on the anisotropic conductive film layer, electrically connected to the first electrodes, and constituting individual pixels, and a plurality of second electrodes disposed between the semiconductor light emitting devices and electrically connected to the semiconductor light emitting devices. Thus, alignment of the semiconductor light emitting device array may be simplified by use of an anisotropic conductive film Due to excellent brightness, the semiconductor light emitting devices, which are small in size, may form individual sub-pixels. In addition, the distance between the semiconductor light emitting devices is sufficiently long to embody a flexible display device.

13 Claims, 8 Drawing Sheets

(52) U.S. Cl.
CPC ............ *H01L33/504* (2013.01); *H01L 33/507* (2013.01); *H01L 33/62* (2013.01); *H01L 33/508* (2013.01); *H01L 2924/0002* (2013.01); *H01L 2933/0033* (2013.01); *H01L 2933/0066* (2013.01)

(56) References Cited

U.S. PATENT DOCUMENTS

| | | | |
|---|---|---|---|
| 2006/0060870 A1* | 3/2006 | Park | H01L 27/322 257/88 |
| 2006/0239037 A1 | 10/2006 | Repetto et al. | |
| 2008/0219006 A1 | 9/2008 | Suzuki et al. | |
| 2008/0308819 A1* | 12/2008 | Louwsma | H01L 27/322 257/89 |
| 2011/0254029 A1 | 10/2011 | Lai | |
| 2012/0087108 A1* | 4/2012 | Ke | H01L 25/0753 362/97.1 |
| 2012/0092389 A1 | 4/2012 | Okuyama | |
| 2012/0119237 A1 | 5/2012 | Leatherdale et al. | |
| 2012/0205614 A1 | 8/2012 | Templier et al. | |

FOREIGN PATENT DOCUMENTS

| | | |
|---|---|---|
| JP | 2005-39129 A | 2/2005 |
| JP | 2006-20561 A | 1/2006 |
| JP | 2006-303509 A | 11/2006 |
| WO | WO 03/012884 A1 | 2/2003 |

* cited by examiner

DISPLAY DEVICE USING SEMICONDUCTOR LIGHT EMITTING DEVICE AND METHOD OF FABRICATING THE SAME

TECHNICAL FIELD

The present invention relates to a display device, and more particularly, to a display device using semiconductor light emitting devices.

BACKGROUND ART

Light emitting diode (LEDs) are well-known semiconductor light emitting devices that convert electric current into light and have been used as light sources for displaying images of electronic equipment including information communication equipment, in conjunction with green GaP:N LEDs, since red LEDs using GaAsP semiconductors were commercialized in 1962.

Nitride compound semiconductors such as gallium nitride (GaN) have high thermal stability and a broad band gap ranging from 0.8 to 6.2 eV, and therefore have received a great deal of attention in fields for the development of high-power output electronic component devices including LEDs.

One of the reasons why gallium nitride (GaN) has attracted a great deal of interest is because it is possible to fabricate semiconductor layers emitting green, blue, and white light, by using GaN in combination with other elements such as indium (In), aluminum (Al), and the like.

Due to the capability to control an emission wavelength via the use of GaN, the emission wavelength may be adjusted to a desired range suited to intrinsic properties of the materials used in compliance with the characteristics of specific equipment. For example, the use of GaN makes it possible to manufacture blue LEDs which are beneficial for optical recording and white LEDs which are capable of replacing incandescent lamps.

Thus, nitride semiconductors are widely used as base materials in manufacturing of blue/green laser diodes and light emitting diodes (LEDs).

Meanwhile, conventionally, liquid crystal display (LCD) devices and active matrix organic light emitting diode (AMOLED) display devices are widely used as flat panel display devices.

However, LCD devices have slow response time and consume a large amount of power caused by reduction in efficiency of a back light unit (BLU) of LED devices. AMOLED display devices have low reliability of organic materials, thereby reducing lifespan to 2 years or less, and have a low productivity.

DISCLOSURE

Technical Problem

An object of the present invention devised to solve the problem lies in a display device using semiconductor light emitting devices by implementing the semiconductor light emitting devices as sub-pixels.

Technical Solution

The object of the present invention can be achieved by providing a display device using a semiconductor light emitting device including a substrate, a plurality of first electrodes disposed on the substrate, an anisotropic conductive film disposed on the substrate provided with the first electrodes, a plurality of semiconductor light emitting devices disposed on the anisotropic conductive film layer, electrically connected to the first electrodes, and constituting individual pixels, and a plurality of second electrodes disposed between the semiconductor light emitting devices and electrically connected to the semiconductor light emitting devices.

The semiconductor light emitting devices may be aligned in plural rows, and the second electrodes may be disposed between the rows of the semiconductor light emitting devices.

The first electrodes and the second electrodes may be bar-shaped electrodes.

The second electrodes may be electrically connected to the semiconductor light emitting devices via connection electrodes protruding from the second electrodes.

The first electrodes and the second electrodes may be aligned to be perpendicular to each other.

Each of the semiconductor light emitting devices may have one side having a length of 50 µm or less.

A barrier wall may further be disposed between the semiconductor light emitting devices.

The barrier wall may include a black or white insulating material.

The display device may further include a wavelength converting layer disposed on the semiconductor light emitting devices.

The semiconductor light emitting devices may be blue semiconductor light emitting devices, and the wavelength converting layer may include a red fluorescent (phosphor) material and a green fluorescent (phosphor) material constituting individual pixels.

The wavelength converting layer may further include a black matrix disposed between the fluorescent (phosphor) materials.

The semiconductor light emitting devices may be blue semiconductor light emitting devices, and the wavelength converting layer may include a red fluorescent (phosphor) material, a green fluorescent (phosphor) material, and a yellow fluorescent (phosphor) material constituting individual pixels.

The semiconductor light emitting devices may include red, green, and blue semiconductor light emitting devices.

The display device may further include thin film transistors including a source region, a drain region, and a gate electrode disposed between the source and drain regions and disposed between the substrate and the first electrodes.

The display device may further include an interlayer insulating layer disposed on the substrate to cover the thin film transistors.

The first electrodes may be electrically connected to the thin film transistors via through-hole electrodes penetrating the interlayer insulating layer.

Red, green, and blue sub-pixels may constitute one pixel, or red, green, blue, and white sub-pixels may constitute one pixel.

In another aspect of the present invention, provided herein is a method of fabricating a display device using a semiconductor light emitting device including coating an anisotropic conductive film on a first substrate on which a plurality of first electrodes is disposed, disposing a second substrate, on which a plurality of semiconductor light emitting devices corresponding to positions of the first electrodes and constituting individual pixels is disposed, to allow the first electrodes and the semiconductor light emitting devices face each other, thermally-pressing the first substrate and the second substrate, removing the second substrate, and forming second electrodes between the semiconductor light emitting devices exposed by removal of the second substrate.

Advantageous Effects

According to the present invention, due to excellent brightness, the semiconductor light emitting devices, which are small in size, may constitute individual sub-pixels. In addition, the distance between the semiconductor light emitting devices is sufficiently long to embody a flexible display device.

In addition, alignment of the semiconductor light emitting device array may be simplified by use of an anisotropic conductive film.

Furthermore, since the distance between the semiconductor light emitting devices, which constitute individual pixels, is sufficiently long, the second electrodes may be disposed between the semiconductor light emitting devices.

It is to be understood that technical advantageous effects to be achieved by the present invention are not limited to the aforementioned technical advantageous effects and other technical advantageous effects which are not mentioned will be apparent from the following description to the person with an ordinary skill in the art to which the present invention pertains.

DESCRIPTION OF DRAWINGS

The accompanying drawings, which are included to provide a further understanding of the invention, illustrate embodiments of the invention and together with the description serve to explain the principle of the invention.

In the drawings.

BEST MODE

Reference will now be made in detail to the preferred embodiments of the present invention, examples of which are illustrated in the accompanying drawings.

It will be apparent to those skilled in the art that various modifications and variations can be made in the present invention without departing from the spirit or scope of the invention. The accompanying drawings are used to provide easy understanding of the technical idea of the present invention and it should be understood that the idea of the present invention is not limited by the accompanying drawings. Accordingly, the concept of the present invention should be construed to extend to any alterations, equivalents and substitutions besides the accompanying drawings.

It will be understood that when an element such as a layer, region or substrate is referred to as being "on" another element, it can be directly on the other element or intervening elements may also be present.

It will be understood that, although the terms first, second, etc. may be used herein to describe various elements, components, regions, layers and/or sections, these elements, components, regions, layers and/or sections should not be limited by these terms.

First Embodiment

Figure 1:
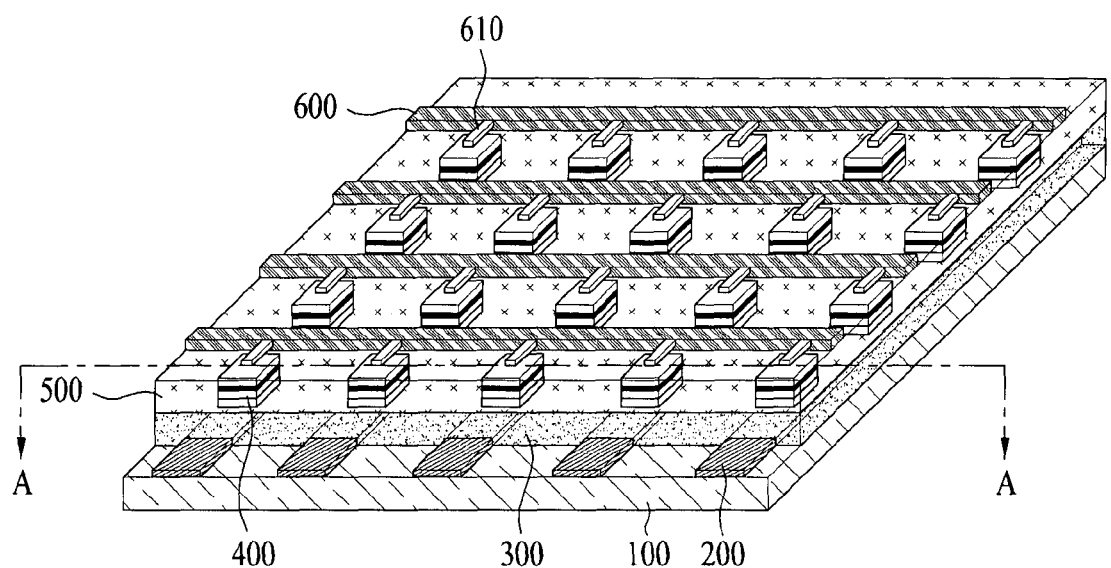
FIG. 1 is a schematic perspective view illustrating a display device using semiconductor light emitting devices according to a first embodiment.
Figure 2:
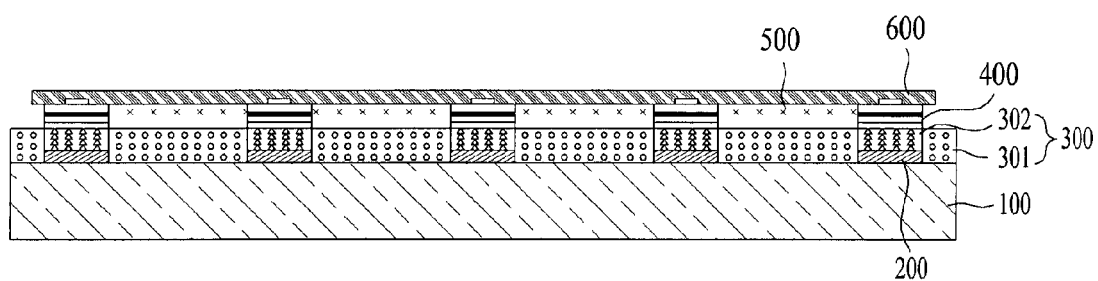
FIG. 2 is a cross-sectional view taken along line A-A of FIG. 1.

FIG. 1 is a schematic perspective view illustrating a display device using semiconductor light emitting devices according to a first embodiment. FIG. 2 is a cross-sectional view taken along line A-A of FIG. 1.

Referring to FIGS. 1 and 2, the display device using semiconductor light emitting devices is a display device of passive matrix (PM) type using semiconductor light emitting devices.

The display device using semiconductor light emitting devices includes a substrate 100, a plurality of first electrodes 200, an anisotropic conductive film 300, a plurality of semiconductor light emitting devices 400, and a plurality of second electrodes 600.

The substrate 100 may be a circuit board on which the first electrodes 200 are aligned. The substrate may include glass or polyimide (PI) to implement a flexible display device. However, any suitable insulating and flexible material may also be used.

The first electrodes 200 function as data electrodes and are disposed on the substrate 100. For example, a plurality of first electrodes 200 may be aligned on the substrate 100 at equal intervals. The first electrodes 200 may be bar-shaped electrodes.

The anisotropic conductive film 300 is formed on the substrate 100 provided with the first electrodes 200. An anisotropic conductive film (ACF) is formed of a plurality of particles in which conductive cores are respectively coated with an insulating film.

When pressure or heat is applied to the anisotropic conductive film, the insulating film is destroyed at regions to which the pressure or heat is applied, such that the regions of the anisotropic conductive film are electrically connected to a layer via exposed cores of the anisotropic conductive film. In this case, the cores may be deformed to be connected to the layer.

For example, after the anisotropic conductive film 300 is disposed on the substrate 100 provided with the first electrodes 200, the semiconductor light emitting devices 400 are connected thereto by applying heat or pressure thereto.

In this case, the anisotropic conductive film 300 becomes conductive at conductive regions 302 between the semiconductor light emitting devices 400 and the first electrodes 200 to which heat or pressure is applied. The anisotropic conductive film 300 is not conductive at non-conductive regions 301 to which heat or pressure is not applied.

Thus, the anisotropic conductive film 300 may not only bond the semiconductor light emitting devices 400 to the first electrodes 200 but also electrically connect the semiconductor light emitting devices 400 with the first electrodes 200.

These semiconductor light emitting devices 400 constitute individual pixels and are disposed on the anisotropic conductive film 300. In addition, the semiconductor light emitting devices 400 are electrically connected to the first electrodes 200.

For example, the first electrodes 200 may be electrically connected to the semiconductor light emitting devices 400 via the conductive regions 302 of the anisotropic conductive film 300 disposed therebetween. In this regard, the semiconductor light emitting devices 400 may be disposed on the first electrodes 200.

Due to excellent brightness, the semiconductor light emitting devices 400, which are small in size, may form individual sub-pixels. Each of the semiconductor light emitting devices 400 may has a rectangular or square shape having one side of 50 μm or less.

For example, a display device using square semiconductor light emitting devices 400 having one side of 10 μm as individual sub-pixels has sufficient brightness.

Thus, in a rectangular sub-pixel having one side of 600 and the other side of 300 μm, distances between the semiconductor light emitting devices 400 are sufficient to implement a flexible display device.

Figure 3:
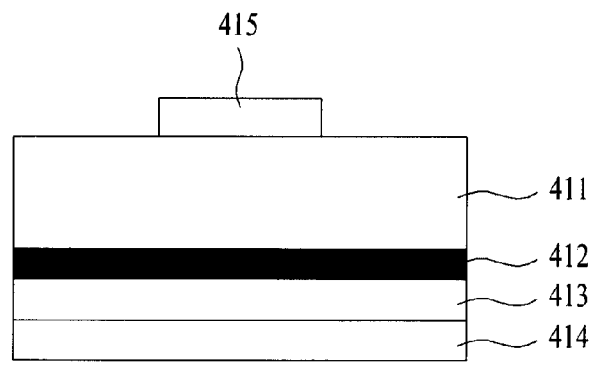
FIG. 3 is a cross-sectional view illustrating a semiconductor light emitting device used in a display device.

FIG. 3 is a cross-sectional view illustrating a semiconductor light emitting device 400 used in the display device. Referring to FIG. 3, the semiconductor light emitting devices 400 has a vertical structure.

The vertical semiconductor light emitting device includes a p-type electrode 414, a p-type semiconductor layer 413 disposed on the p-type electrode 414, an active layer 412 disposed on the p-type semiconductor layer 413, an n-type semiconductor layer 411 disposed on the active layer 412, and an n-type electrode 415 disposed on the n-type semiconductor layer 411.

In this case, the p-type electrode 414 disposed at a lower portion may be electrically connected to the first electrode 200 via a conductive region 302 of the anisotropic conductive film 300. The n-type electrode 415 disposed at an upper portion may be electrically connected to the second electrode 600, which will be described later.

A chip size of the vertical semiconductor light emitting device 400 may be reduced since the electrodes are disposed at upper and lower portions thereof.

Meanwhile, nitride semiconductor light emitting devices may be used as the semiconductor light emitting devices 400. Such nitride semiconductor light emitting devices may include gallium nitride (GaN), as a main element, and indium (In) and/or aluminum (Al) to realize high power output light emitting devices emitting various colors of light including blue light.

The second electrodes 600 are disposed between the semiconductor light emitting devices 400 and are electrically connected to the semiconductor light emitting devices 400.

For example, the semiconductor light emitting devices 400 are aligned in plural of rows, and each of the second electrodes 600 may be disposed between the rows of the semiconductor light emitting devices 400. A distance between the semiconductor light emitting devices 400 constituting individual pixels is sufficiently long to allow each of the second electrodes 600 to be disposed between the semiconductor light emitting devices 400.

The second electrodes 600 may be bar-shaped electrodes. For example, the first electrodes 200 and the second electrodes 600 may be aligned to be perpendicular to each other, respectively. As a result, a PM structure is formed.

In addition, the second electrodes 600 may be electrically connected to the semiconductor light emitting devices 400 via connection electrodes 610 protruding from the second electrodes 600. For example, in a vertical semiconductor light emitting device 400, the second electrode 600 may be electrically connected to the n-type electrode of the semiconductor light emitting devices 400 via the connection electrode 610.

The second electrodes 600 may be disposed directly on the anisotropic conductive film 300. As occasion demands, a transparent insulating layer (not shown) including silicon oxide ($SiO_x$), and the like may be formed on the substrate 100 provided with the semiconductor light emitting devices 400, and then the second electrodes 600 may be disposed on the transparent insulating layer.

In addition, the second electrodes 600 may be formed spaced apart from the anisotropic conductive film 300 or the transparent insulating layer.

Meanwhile, in order to dispose the second electrodes 600 on the semiconductor light emitting devices 400, a transparent electrode formed of, for example, indium tin oxide (ITO), is to be used. However, an ITO-based material has a low adhesiveness to the n-type semiconductor layer.

Accordingly, horizontal second electrodes 600 are respectively disposed between the semiconductor light emitting devices 400. Thus, it may not necessary to form a transparent electrode such as an ITO electrode.

Therefore, materials used to form the second electrodes 600 are not limited to transparent materials. Instead, a conductive material with high adhesiveness to the n-type semiconductor layer may be used to form the horizontal second electrodes 600 to improve light extraction efficiency.

A barrier wall 500 may further be disposed between the vertical semiconductor light emitting devices 400 in order to isolate each of the semiconductor light emitting devices 400 constituting individual pixels.

In this regard, the barrier wall 500 may isolate individual sub-pixels from each other and a reflective barrier wall may be used as the barrier wall 500.

The barrier wall 500 may include a black or white insulating material in accordance with function of the display device. When a barrier wall 500 including a white insulating material is used, reflectivity may be improved. When a barrier wall 500 including a black insulating material is used, a contrast ratio may be improved while having reflectivity.

Meanwhile, when the second electrodes 600 are disposed on the anisotropic conductive film 300 between the semiconductor light emitting devices 400, the barrier wall 500 may be disposed between the vertical semiconductor light emitting devices 400 and between the second electrodes 600.

Thus, the semiconductor light emitting devices 400, which are small in size, may constitute individual sub-pixels. Since the distance between the semiconductor light emitting devices 400 is sufficiently long to allow the second electrodes 600 to be disposed between the semiconductor light emitting devices 400. Thus, a flexible display deice may be implemented.

In addition, the structure of the semiconductor light emitting device array may be simplified by use of an anisotropic conductive film. Particularly, the vertical semiconductor light emitting devices have a simpler design.

Second Embodiment

Figure 4:
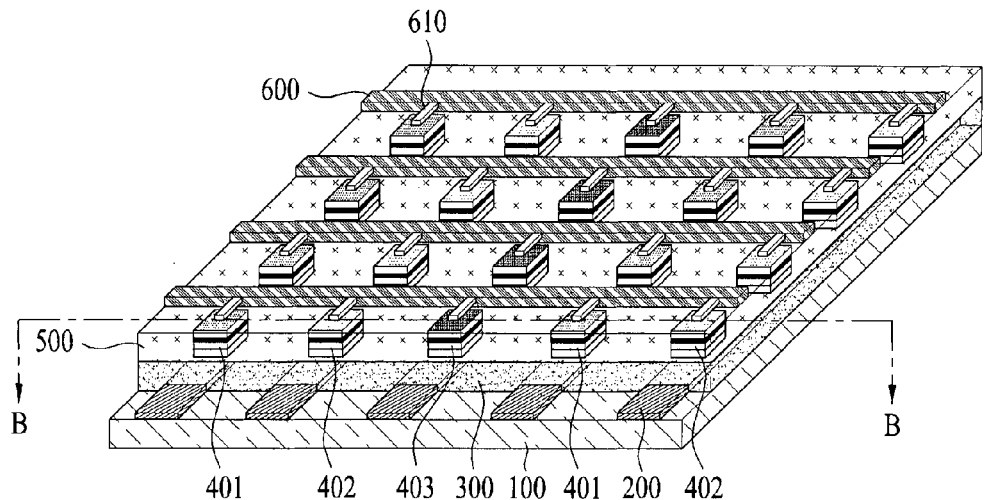
FIG. 4 is a schematic perspective view illustrating a display device using semiconductor light emitting devices according to a second embodiment.
Figure 5:
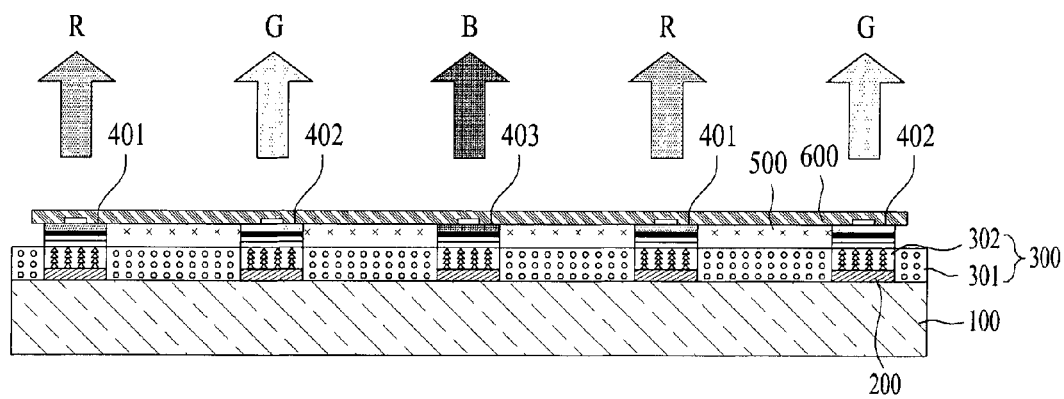
FIG. 5 is a cross-sectional view taken along line B-B of FIG. 4.

FIG. 4 is a schematic perspective view illustrating a display device using semiconductor light emitting devices according to a second embodiment. FIG. 5 is a cross-sectional view taken along line B-B of FIG. 4.

Referring to FIGS. 4 and 5, a full color display of PM type to which a semiconductor light emitting device array is applied is illustrated.

The display device using semiconductor light emitting devices includes a substrate 100, a plurality of first electrodes 200, an anisotropic conductive film 300, a plurality of semiconductor light emitting devices 400, a barrier wall 500, and a plurality of second electrodes 600.

That is, a plurality of first electrodes 200 is disposed on the substrate 100 and the anisotropic conductive film 300 is disposed thereon.

In addition, a plurality of semiconductor light emitting devices 400 is disposed on the anisotropic conductive film 300 to be electrically connected to the first electrodes 200 and constitute individual pixels (sub-pixels). For example, the semiconductor light emitting devices 400 may respectively have a vertical structure.

In addition, a plurality of second electrodes 600 is disposed between the semiconductor light emitting devices 400 to be perpendicular to the lengthwise direction of the first electrodes 200 and electrically connected to the vertical semiconductor light emitting devices 400.

A barrier wall 500 is disposed between the semiconductor light emitting devices 400.

In this case, the semiconductor light emitting devices 400 may be red, green, and blue semiconductor light emitting devices 401, 402, and 403 to constitute sub-pixels.

For example, a full color display, in which red, green, and blue semiconductor light emitting devices 401, 402, and 403 are sequentially aligned, and red, green, and blue sub-pixels constitute one pixel -by use of the red, green, and blue semiconductor light emitting devices 401, 402, and 403, may be designed.

Third Embodiment

Figure 6:
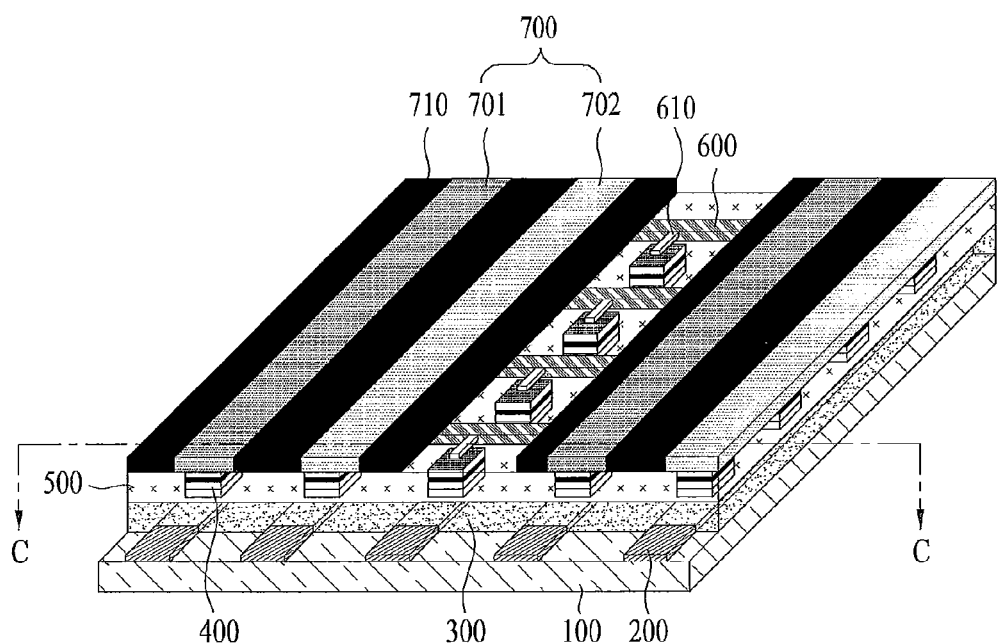
FIG. 6 is a schematic perspective view illustrating a display device using semiconductor light emitting devices according to a third embodiment.
Figure 7:
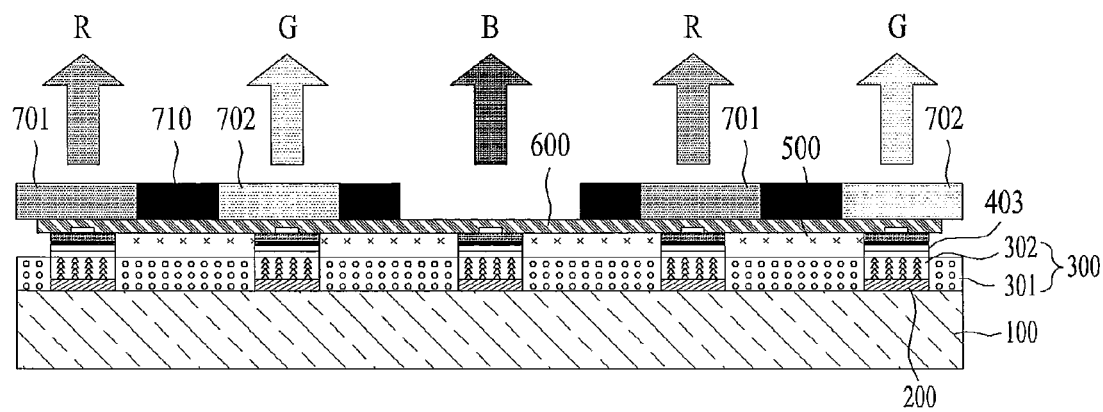
FIG. 7 is a cross-sectional view taken along line C-C of FIG. 6.

FIG. 6 is a schematic perspective view illustrating a display device using semiconductor light emitting devices according to a third embodiment. FIG. 7 is a cross-sectional view taken along line C-C of FIG. 6.

Referring to FIGS. 6 and 7, a full color display of PM type in which a wavelength converting layer 700 is applied to a semiconductor light emitting device array is illustrated.

The display device using semiconductor light emitting devices includes a substrate 100, a plurality of first electrodes 200, an anisotropic conductive film 300, a plurality of semiconductor light emitting devices 400, a barrier wall 500, a plurality of second electrodes 600, and a wavelength converting layer 700.

That is, a plurality of first electrodes 200 is disposed on the substrate 100, and the anisotropic conductive film 300 is disposed thereon.

In addition, a plurality of semiconductor light emitting devices 400, which constitute individual pixels and are electrically connected to the first electrodes 200, is disposed on the anisotropic conductive film 300. For example, the semiconductor light emitting devices 400 may respectively have a vertical structure.

In addition, a plurality of second electrodes 600 is respectively disposed between the semiconductor light emitting devices 400 to be perpendicular to the lengthwise direction of the first electrodes 200 and electrically connected to the vertical semiconductor light emitting devices 400

A barrier wall 500 is disposed between the semiconductor light emitting devices 400.

In addition, the wavelength converting layer 700 is disposed on the semiconductor light emitting devices 400.

For example, the semiconductor light emitting devices 400 may be blue semiconductor light emitting devices 403 that emit blue (B) light, and the wavelength converting layer 700 converting blue (B) into colors of sub-pixels may be mounted thereon.

In this regard, the wavelength converting layer 700 may include a red fluorescent (phosphor) material 701 and a green fluorescent (phosphor) material 702 constituting individual sub-pixels.

That is, at a red sub-pixel, the red fluorescent (phosphor) material 701, which may convert blue (B) light into red (R) light, may be formed on the blue semiconductor light emitting device 403. At a green sub-pixel, the green fluorescent (phosphor) material 702, which may convert blue (B) light into green (G) light may be formed on the blue semiconductor light emitting device 403.

In addition, at a blue sub-pixel, the blue (B) semiconductor light emitting device 403 may be formed alone. In this case, the red (R), green (G), and blue (B) sub-pixels may constitute one pixel.

Meanwhile, if required, the semiconductor light emitting devices 400 may be white light emitting devices respectively including a yellow wavelength converting layer. In this case, a red fluorescent (phosphor) material, a green fluorescent (phosphor) material, and a blue fluorescent (phosphor) material may be disposed on the white light emitting devices to form sub-pixels.

In addition, sub-pixels may be formed using a color filter, in which red, green, and blue are repeatedly disposed.

In this regard, a black matrix 710 may be disposed between the fluorescent (phosphor) materials in order to increase a contrast ratio. That is, the black matrix 710 may improve contrast.

Thus, a full color display in which the red (R), green (G), and blue (B) sub-pixels constitute one pixel may be designed by applying the red and green fluorescent (phosphor) materials to the blue semiconductor light emitting devices 300.

Fourth Embodiment

Figure 8:
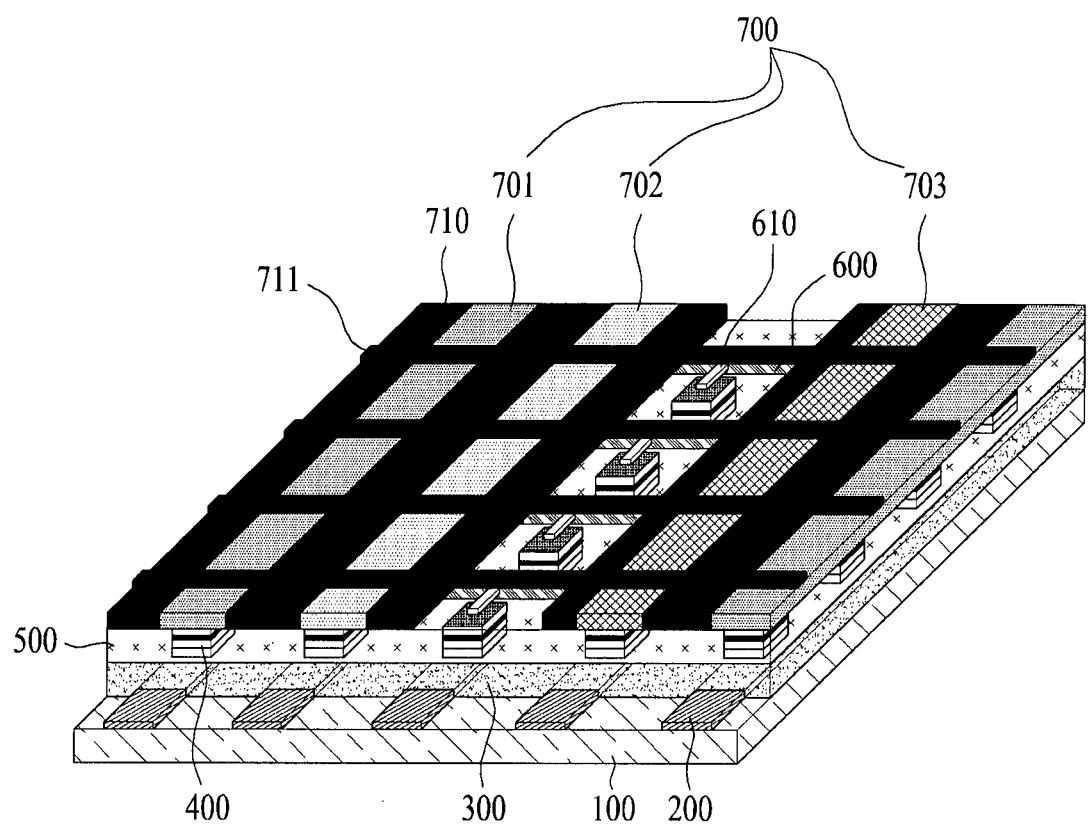
FIG. 8 is a schematic perspective view illustrating a display device using semiconductor light emitting devices according to a fourth embodiment.

FIG. 8 is a schematic perspective view illustrating a display device using semiconductor light emitting devices according to a fourth embodiment.

Referring to FIG. 8, a full color display of PM type in which a wavelength converting layer is applied to a semiconductor light emitting device array is illustrated.

The full color display device illustrated in FIG. 8 has the same structure as the full color display device according to the third embodiment, except that red (R), green (G), blue (B), and white (W) sub-pixels constitute one pixel by applying a red fluorescent (phosphor) material 701, a green fluorescent (phosphor) material 702, and a yellow fluorescent (phosphor) material 703 to the blue semiconductor light emitting devices 403.

In addition, contrast may further be improved by use of not only a black matrix 710 disposed between the fluorescent (phosphor) materials but also a black matrix 711 disposed on the wavelength converting layer 700 to isolate the luminescent regions of the semiconductor light emitting devices 400.

Thus, when full white is realized in the full color display structure in which the red (R), green (G), blue (B), and white (W) sub-pixels constitute one pixel, power may be reduced by maximizing efficiencies of the blue semiconductor light emitting devices and the yellow fluorescent (phosphor) material.

Fifth Embodiment

Figure 9:
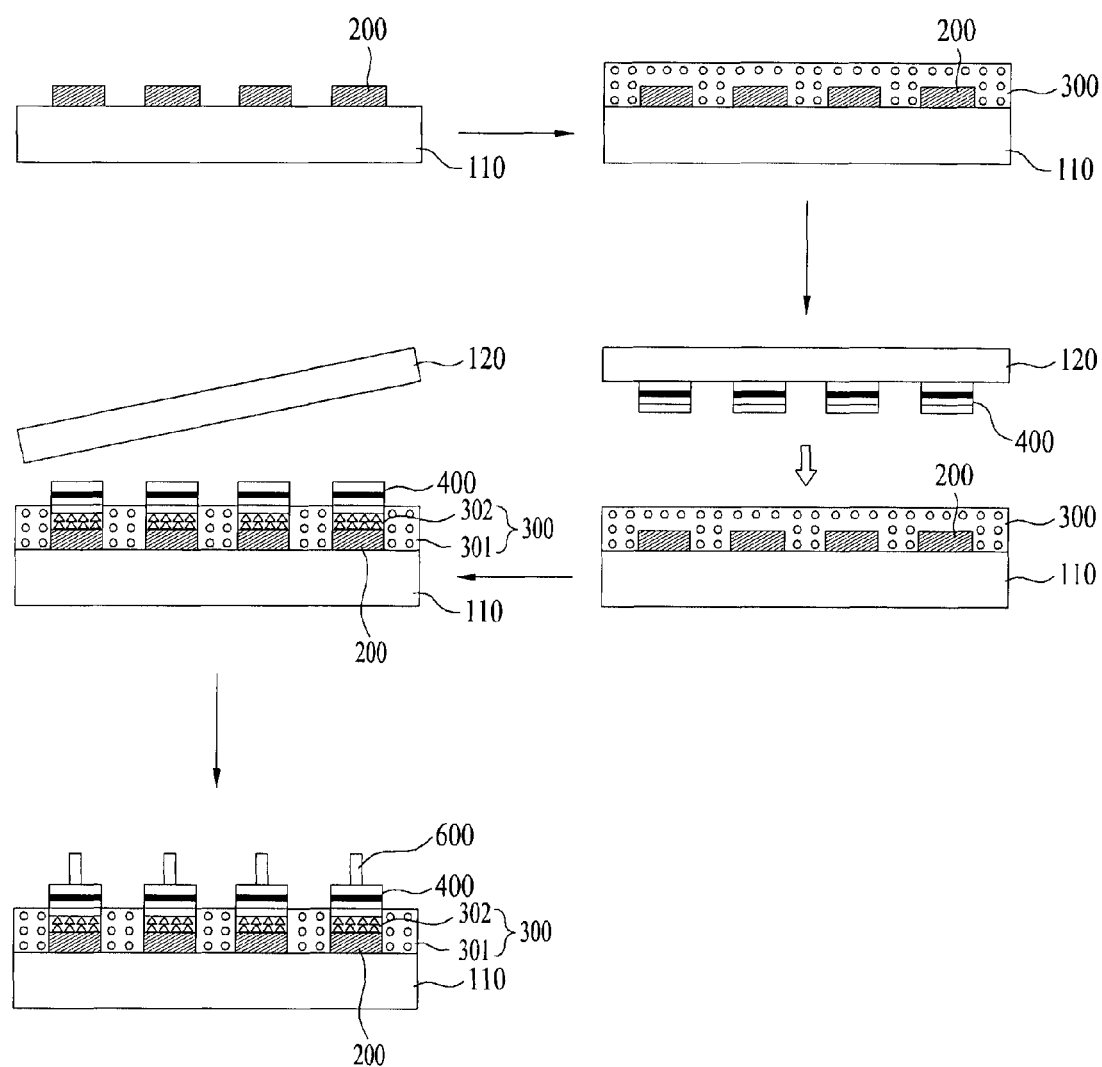
FIG. 9 illustrates cross-sectional views for describing a method of fabricating a display device using semiconductor light emitting devices according to a fifth embodiment.

FIG. 9 illustrates cross-sectional views for describing a method of fabricating a display device using semiconductor light emitting devices according to a fifth embodiment.

Referring to FIG. 9, first, an anisotropic conductive film (ACF) 300 is formed by coating an anisotropic conductive film on a first substrate 110 on which a plurality of first electrodes 200 is disposed.

The first substrate 110 is a circuit board on which the first electrodes 200 are aligned. The substrate 110 may include glass or polyimide (PI) to implement a flexible display device.

Then, a second substrate 120 provided with a plurality of semiconductor light emitting devices 400, which correspond to the positions of the first electrodes 200 and constitute individual pixels, is disposed such that the first electrodes 200 respectively face the semiconductor light emitting devices 400.

The second substrate 120 is a growth substrate from which vertical semiconductor light emitting devices 400 are grown and may be a sapphire substrate or a silicon substrate.

Then, the first substrate 110 and the second substrate 120 are thermally pressed. Accordingly, the first substrate 110 and the second substrate 120 are bonded to each other.

Accordingly, the first electrodes 200 and the semiconductor light emitting devices 400 may be respectively electrically connected to each other since only contact regions of the anisotropic conductive film 300 between the first electrodes 200 and the semiconductor light emitting devices 400 become conductive by thermal pressing.

For example, the first substrate 110 and the second substrate 120 may be thermally pressed by application of an ACF press head.

Then, the second substrate 120 is removed. For example, the second substrate 120 may be removed by laser lift-off (LLO) or chemical lift-off (CLO).

Then, the second electrodes 600 are formed between the semiconductor light emitting devices 400 exposed by removal of the second substrate 120.

Here, the semiconductor light emitting devices 400 and the second electrodes 600 are electrically connected to each other. For example, the semiconductor light emitting devices 400 are aligned in plural rows, and the second electrodes 600 may be aligned between the rows of the semiconductor light emitting devices 400.

In addition, the second electrodes 600 may be electrically connected to the semiconductor light emitting devices 400 via connection electrodes 610 protruding from the second electrodes 600.

In addition, the first electrodes 200 and the second electrodes 600 may be aligned to be perpendicular to each other, respectively.

Then, if required, a transparent insulating layer (not shown) may be formed by coating silicon oxide ($SiO_x$) or the like on the substrate 110 provided with the semiconductor light emitting devices 400 and the second electrodes 600.

If required, the transparent insulating layer may be coated on the substrate 110 provided with the semiconductor light emitting devices 400 before formation of the second electrodes 600. In this regard, the second electrodes 600 may be disposed on the transparent insulating layer.

In addition, the fabrication method may further include forming a barrier wall (not shown) between the vertical semiconductor light emitting devices 400.

For example, the barrier wall may be disposed by filling a space between the semiconductor light emitting devices 400. Alternatively, the barrier wall may be formed by lamination and etching using a mask.

Meanwhile, the semiconductor light emitting devices used in the display device may be processed so as to have distances and sizes suitable for the display device when a wafer is formed. Accordingly, the semiconductor light emitting devices may be efficiently applied to the display device.

Figure 10:
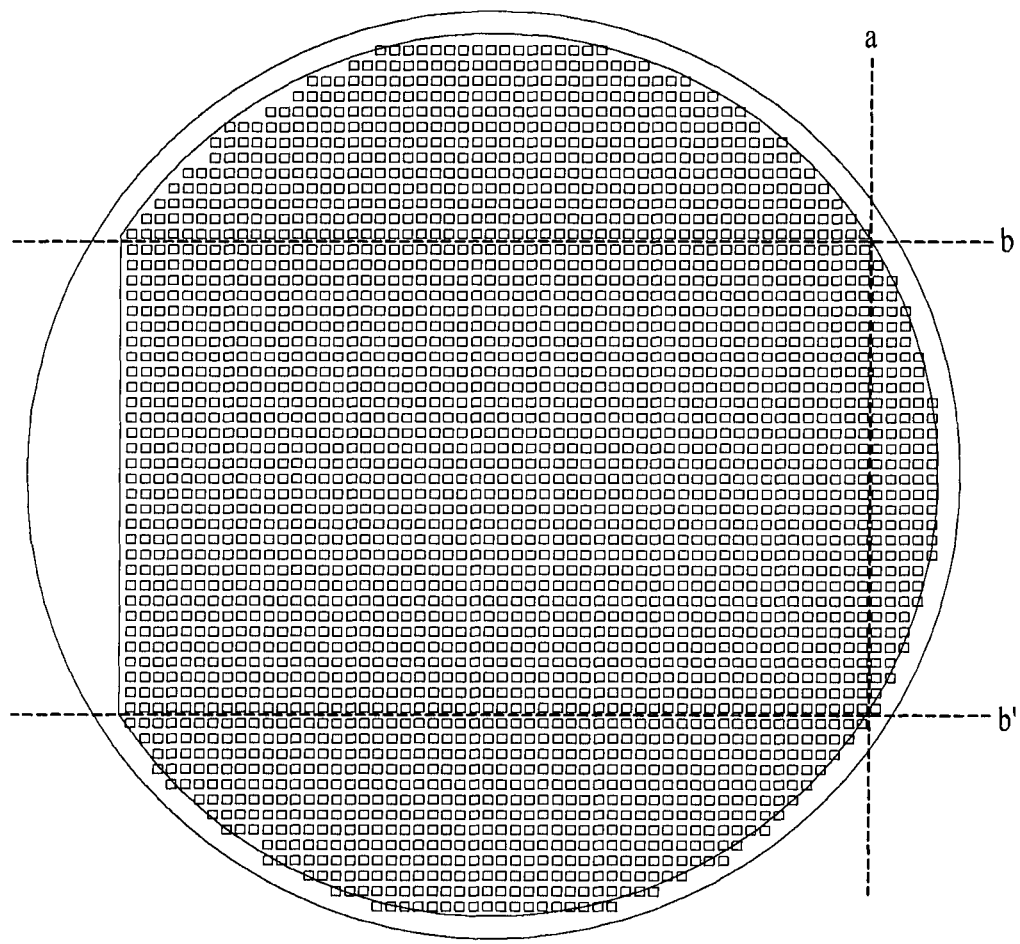
FIG. 10 is a plan view illustrating a wafer on which semiconductor light emitting devices for a display device are formed.

FIG. 10 is a plan view illustrating a wafer on which semiconductor light emitting devices for a display device are formed.

As illustrated in FIG. 10, a region of a wafer provided with individual semiconductor light emitting devices defined with a-line, b-line, and b'-line may be used in a display device.

In this regard, an area of the display device may be proportional to a size of the wafer. That is, as the wafer increases in size, multiple display devices may be achieved from a single wafer.

Sixth Embodiment

Figure 11:
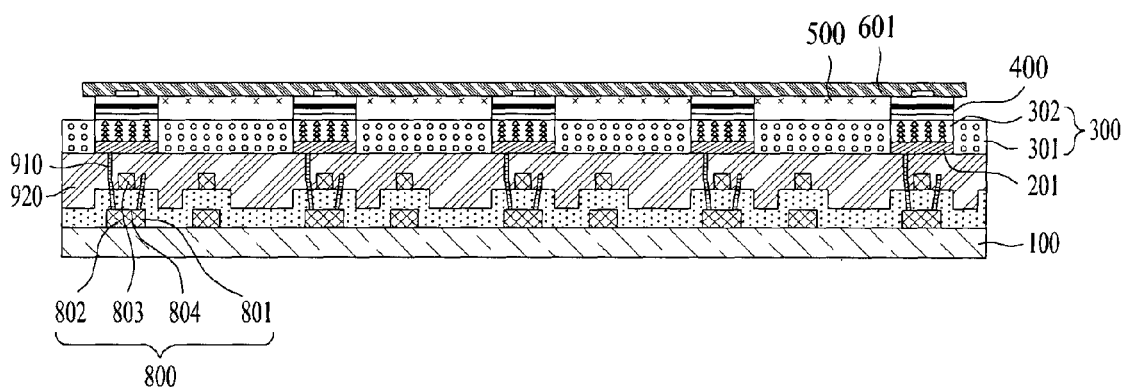
FIG. 11 is a cross-sectional view illustrating a display device using semiconductor light emitting devices according to a sixth embodiment.

FIG. 11 is a cross-sectional view illustrating a display device using semiconductor light emitting devices according to a sixth embodiment.

Referring to FIG. 11, a display device of active matrix (AM) type using semiconductor light emitting devices 400 is illustrated.

The display device using semiconductor light emitting devices includes a substrate 100, thin film transistors 800, an interlayer insulating film 920, a plurality of first electrodes 201, an anisotropic conductive film 300, a plurality of semiconductor light emitting devices 400, and a plurality of second electrodes 601.

The substrate 100 may be a circuit substrate, for example, a circuit substrate in which scan lines and data lines are formed.

The thin film transistors 800 are disposed on the substrate 100. Each of the thin film transistors 800 includes a source region 801, a drain region 802, and a gate electrode 803, and a channel region 804 is disposed between the source region 801 and the drain region 802.

For example, a data line is connected to the source region 801 of the thin film transistor 800, a scan line is connected to the gate electrode 803, and a first electrode 201, namely, a pixel electrode 201, is connected to the drain region 802.

Accordingly, pixels emitting light may be driven by the thin film transistors 800, and thus colors may be actively embodied by the pixels.

The interlayer insulating layer 920 may be formed on the substrate 100 provided with the thin film transistors 800 to cover the thin film transistors 800.

The first electrodes 201 function as pixel electrodes, are disposed on the interlayer insulating layer 920, and are aligned to correspond to the thin film transistors 800.

For example, the first electrodes 201 may be formed in dot shapes. In this regard, each of the first electrodes 201 may be electrically connected to the source region 801 of each of the thin film transistors 800 via a through-hole electrode 910 that penetrates the interlayer insulating layer 920.

The anisotropic conductive film 300 is formed on the substrate 100 provided with the first electrodes 201.

The semiconductor light emitting devices 400 are disposed on the anisotropic conductive film 300 to respectively correspond to the first electrodes 201. For example, the semiconductor light emitting devices 400 may respectively have a vertical structure.

The second electrodes 601 are common electrodes disposed between the semiconductor light emitting devices 400 and electrically connected to the semiconductor light emitting devices 400.

In addition, a barrier wall may further be disposed between the semiconductor light emitting devices 400.

In this regard, the semiconductor light emitting devices 400 may include red, green, and blue semiconductor light emitting devices 401, 402, and 403. The red, green, and blue semiconductor light emitting devices 401, 402, and 403 may be sequentially aligned and constitute red, green, and blue sub-pixels. Accordingly, a full color display device in which the three sub-pixels constitute one pixel may be designed.

In addition, when all of the semiconductor light emitting devices 400 are blue semiconductor light emitting devices 403, a wavelength converting layer including a red fluorescent (phosphor) material and a green fluorescent (phosphor) material may further be disposed on the blue semiconductor light emitting devices 403 to realize a full color display device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A display device using a semiconductor light emitting device comprising:
    a substrate;
    a plurality of first electrodes disposed on the substrate;
    an anisotropic conductive film disposed on the substrate provided with the plurality of first electrodes;
    a plurality of semiconductor light emitting devices disposed on the anisotropic conductive film layer, electrically connected to the plurality of first electrodes, and constituting individual pixels;
    a plurality of second electrodes disposed between the plurality of semiconductor light emitting devices and electrically connected to the plurality of semiconductor light emitting devices; and
    a wavelength converting layer disposed on the plurality of semiconductor light emitting devices, wherein:
    red, green, and blue sub-pixels constitute a pixel or red, green, blue, and white sub-pixels constitute a pixel,
    the plurality of semiconductor light emitting devices are blue semiconductor light emitting devices,
    the wavelength converting layer includes red portions having a red fluorescent (phosphor) material and green portions having a green fluorescent (phosphor) material,
    the red portions and the green portions are bar-shaped portions extending in a direction parallel to the plurality of first electrodes, and
    the red portions and the green portions are alternately disposed in a direction parallel to the plurality of second electrodes.

2. The display device according to claim 1, wherein:
    the plurality of semiconductor light emitting devices are aligned in plural rows; and
    the plurality of second electrodes are disposed between the rows of the plurality of semiconductor light emitting devices.

3. The display device according to claim 2, wherein the plurality of first electrodes and the plurality of second electrodes comprise bar-shaped electrodes.

4. The display device according to claim 1, wherein the plurality of second electrodes are electrically connected to the plurality of semiconductor light emitting devices via connection electrodes protruding from the plurality of second electrodes.

5. The display device according to claim 1, wherein the plurality of first electrodes and the second electrodes are aligned to be perpendicular to each other.

6. The display device according to claim 1, wherein each of the plurality of semiconductor light emitting devices has one side having a length of 50 μm or less.

7. The display device according to claim 1, wherein a barrier wall is further disposed between the plurality of semiconductor light emitting devices.

8. The display device according to claim 7, wherein the barrier wall comprises a black or white insulating material.

9. The display device according to claim 1, wherein the wavelength converting layer further comprises a black matrix disposed between the fluorescent (phosphor) materials.

10. The display device according to claim 1, wherein the wavelength converting layer further comprises a yellow fluorescent (phosphor) material constituting individual pixels.

11. The display device according to claim 1, further comprising thin film transistors comprising a source region, a drain region, and a gate electrode disposed between the source and drain regions and disposed between the substrate and the plurality of first electrodes.

12. The display device according to claim 11, further comprising an interlayer insulating layer disposed on the substrate to cover the thin film transistors.

13. The display device according to claim 12, wherein the plurality of first electrodes are electrically connected to the thin film transistors via through-hole electrodes penetrating the interlayer insulating layer.

* * * * *